(12) United States Patent  (10) Patent No.: US 7,792,506 B1
Wright  (45) Date of Patent: Sep. 7, 2010

(54) POWER-CONTROL CIRCUIT WITH THRESHOLD LIMITING CHARACTERISTICS

(75) Inventor: Peter V. Wright, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 572 days.

(21) Appl. No.: 11/875,696

(22) Filed: Oct. 19, 2007

Related U.S. Application Data

(60) Provisional application No. 60/853,160, filed on Oct. 20, 2006.

(51) Int. Cl.
*H04B 1/04* (2006.01)
(52) U.S. Cl. ............... 455/127.1; 455/232.1; 455/127.2; 330/250
(58) Field of Classification Search ... 455/127.1–127.5, 455/232.1–253.1, 78; 330/250–311, 147, 330/148; 327/323, 393, 63; 361/92
See application file for complete search history.

(56) References Cited

U.S. PATENT DOCUMENTS

| | | | | |
|---|---|---|---|---|
| 4,780,630 A | * | 10/1988 | Corpechot et al. | .......... 327/361 |
| 5,933,055 A | * | 8/1999 | Dosho | ........................ 330/261 |
| 6,037,830 A | * | 3/2000 | Mil'shtein et al. | ........ 455/127.2 |
| 6,657,485 B2 | * | 12/2003 | Kimura | ...................... 330/253 |
| 6,701,138 B2 | | 3/2004 | Epperson et al. | |
| 6,850,119 B2 | | 2/2005 | Arnott | |
| 6,917,504 B2 | * | 7/2005 | Nguyen et al. | ............... 361/100 |
| 7,528,634 B2 | * | 5/2009 | Can | .............................. 327/62 |
| 2005/0093629 A1 | * | 5/2005 | Nishimura et al. | ........... 455/334 |
| 2005/0151587 A1 | * | 7/2005 | Ozasa et al. | ................. 330/253 |
| 2008/0284392 A1 | * | 11/2008 | Itoh | ......................... 455/127.1 |

* cited by examiner

*Primary Examiner*—Lana N Le
(74) *Attorney, Agent, or Firm*—Booth Udall, PLC

(57) ABSTRACT

A current limiting circuit including a transistor is disclosed. The current limiting circuit is coupled with a voltage and includes a summing network, wherein a first voltage input of the summing network is capable of receiving a voltage that is proportional with the current flowing through the transistor. The current limiting circuit further including a differential circuit, wherein a first input of the differential circuit is coupled with an output of the summing network, a second input of the differential circuit is coupled with a voltage ramp signal, and an output of the differential circuit is coupled with a gate of the transistor. The current limiting circuit still further including a voltage divider network coupled between the drain of the transistor and the second voltage input of the summing network.

25 Claims, 5 Drawing Sheets

POWER-CONTROL CIRCUIT WITH THRESHOLD LIMITING CHARACTERISTICS

CROSS-REFERENCE TO RELATED APPLICATIONS

This application hereby claims the benefit under 35 U.S.C. §119(e) of U.S. Provisional Patent Application Ser. No. 60/853,160, filed 20 Oct. 2006, entitled "POWER-CONTROL ARCHITECTURE WITH THRESHOLD LIMITING CHARACTERISTICS". The present invention is related to that disclosed in U.S. Provisional Patent Application Ser. No. 60/853,160. U.S. Provisional Patent Application Ser. No. 60/853,160 is assigned to the assignee of the present application. The subject matter disclosed in U.S. Provisional Patent Application Ser. No. 60/853,160 is hereby incorporated by reference into the present disclosure as if fully set forth herein.

TECHNICAL FIELD OF THE INVENTION

Embodiments of the present invention relate generally to radio frequency (RF) power amplifiers and more specifically, to a power-control circuit with threshold limiting characteristics.

BACKGROUND OF THE INVENTION

Radio frequency (RF) power amplifiers are often used in wireless devices, such as cellular telephones. Extending the battery life is a key concern for users and manufacturers of these wireless devices. One of the key factors in determining the battery life of a wireless device is the power consumption of the RF power amplifiers. The RF power amplifiers are designed to operate into an optimal load impedance and are typically coupled to an antenna of the wireless device.

However, under a load mismatch condition, such as, for example, when the antenna of the wireless device approaches objects (e.g., metal structures, human contact, a hand, etc., in the near field of the antenna, or the like), the load impedance of the RF power amplifier changes and the RF power amplifier draws excess current. In some cases, the current can exceed more than two times the current drawn under an optimal load impedance. When the RF power amplifier draws excess current, the battery life of the wireless device is reduced. In addition, the adjacent channel power ratio (ACPR) and error vector magnitude (EVM) linearity and distortion limits are often exceeded when the RF power amplifier draws excess current. This reduction in battery life and distortion limits of the wireless device is undesirable.

FIG. 1 illustrates a schematic diagram of a power-control circuit 100 according to the prior art. Power-control circuit 100 includes a low drop-out (LDO) circuit 102, RF amplifier stages A1-A3, a battery voltage $V_{BATT}$, an $RF_{IN}$ signal, a $RF_{OUT}$ signal and a $V_{RAMP}$ signal. LDO circuit 102 includes a divider network R1 and R2, a comparator 104, and a transistor Q1. As the collector voltage $V_{CC}$ in the RF amplifier stages A1-A3 decreases, due to, for example, a load mismatch condition, comparator 104 senses voltage Vd across the divider network R1 and R2 and compares voltage Vd with $V_{AMP}$. The output of comparator 104 is applied to transistor Q1, which adjusts collector voltage $V_{CC}$ until voltage Vd equalizes with the $V_{RAMP}$ signal, thereby substantially maintaining the collector voltage $V_{CC}$ at a specified voltage.

However, the use of power-control circuit 100 is disadvantageous, because LDO circuit 102 does not provide a mechanism to limit the amount of current that is driven into the RF amplifier stages A1-A3. For example, under a load mismatch condition, LDO circuit 102 will continue to drive as much current as is necessary in order to maintain the collector voltage $V_{CC}$ constant with respect to the $V_{RAMP}$ signal. Among other things, this reduces the efficiency of RF amplifier stages A1-A3 and decreases the battery life of the wireless device, which, as described above, is disadvantageous for users and manufacturers of these wireless devices.

Another disadvantage of power-control circuit 100 is that it adversely affects the characteristics of the power control loop of the LDO circuit, even under normal operation. For example, as the collector voltage $V_{CC}$ is ramping to a specified output limit, as defined by the $V_{RAMP}$ signal, a sharp discontinuity occurs when the collector voltage $V_{CC}$ equals the $V_{RAMP}$ signal. This sharp discontinuity is commonly referred to as a hard limit and causes various spurious emissions and unwanted harmonics in the frequency domain. These spurious emissions and unwanted harmonics are undesirable.

BRIEF DESCRIPTION OF THE DRAWINGS

The novel features believed to be characteristic of embodiments of the invention are set forth in the appended claims. However, embodiments of the invention will best be understood by reference to the following detailed description when read in conjunction with the accompanying drawings, wherein embodiments of the invention are illustrated by way of example, and not by way of limitation, in the figures of the accompanying drawings in which like reference numerals refer to similar elements.

DETAILED DESCRIPTION OF THE INVENTION

Reference will now be made to the following detailed description of the exemplary embodiments of the present invention. Those skilled in the art will recognize that embodiments of the present invention provide many inventive concepts and novel features that are merely illustrative and not to be construed as restrictive. Accordingly, the specific embodiments discussed herein are given by way of example and do not limit the scope of the embodiments of the present invention. In addition, those skilled in the art will understand that for purposes of explanation, numerous specific details are set forth, though embodiments of the invention can be practiced without these specific details, and that certain features have been omitted so as to more clearly illustrate embodiments of the invention.

Figure 1:
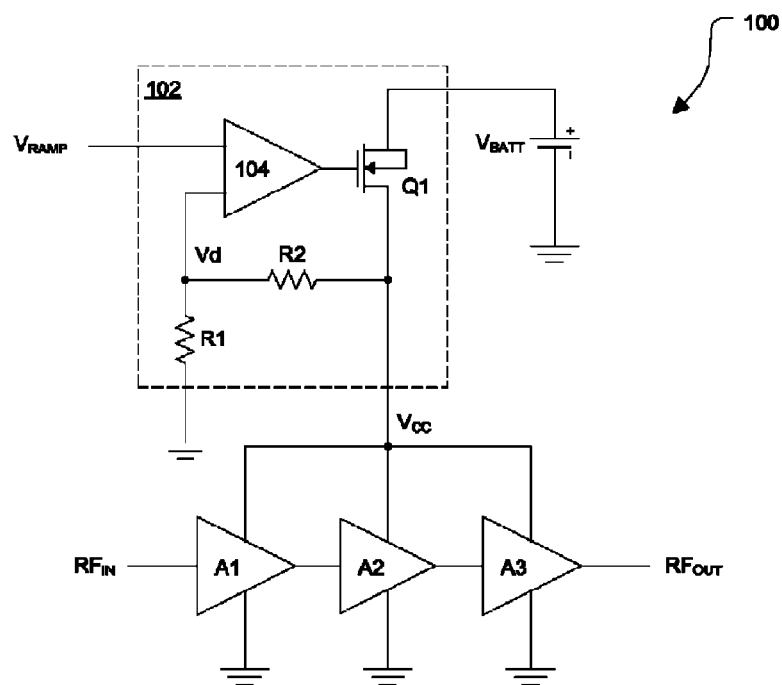
FIG. 1 illustrates a schematic diagram of a power-control circuit according to the prior art.
Figure 2:
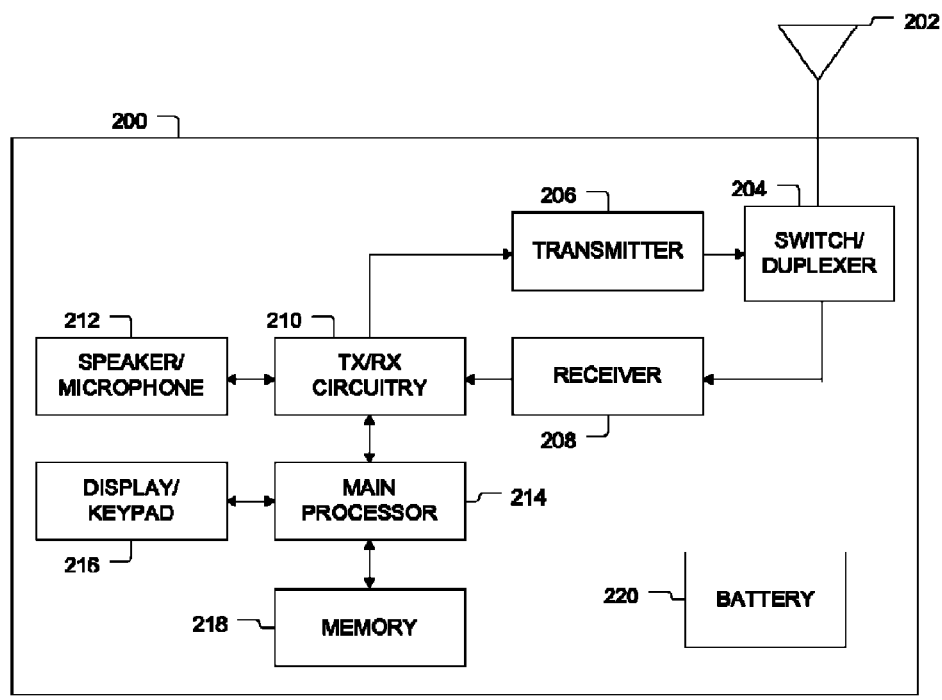
FIG. 2 illustrates a high-level block diagram of a wireless device according to an exemplary embodiment of the present invention.

FIG. 2 illustrates a high-level block diagram of a wireless device 200 according to an exemplary embodiment of the present invention. In one embodiment of the present invention, wireless device 200 comprises an antenna 202, a switch/duplexer 204, a transmitter 206, a receiver 208, TX/RX circuitry 210, a speaker/microphone 212, a main processor 214, a display/keypad 216, a memory 218, and a battery 220. Wireless device 200 may be any wireless device, including, but not limited to, conventional cellular telephones, paging devices, personal digital assistant devices, text-messaging devices, portable computers, or any other like device capable of wireless communication.

As will be explained below in greater detail, transmitter 206 comprises radio frequency (RF) power amplifier circuitry including one or more current limiting circuits, one or more RF power amplifier stages, and other like circuitry. In one embodiment of the present invention, the RF power amplifier circuitry of transmitter 206 is formed on a Gallium Arsenide (GaAs) substrate. However, other semiconductor materials (e.g., silicon, silicon germanium, indium phosphide, gallium nitride, silicon carbide) may be used. In addition, for purposes of illustration and ease of explanation, embodiments of the present invention are described in terms of bipolar junction transistor (BJT) technology (e.g., heterojunction bipolar transistors (HBTs)). However, embodiments of the invention may be practiced using other transistor technology, including, for example, but not limited to, field effect transistor (FET) technology (e.g., metal-semiconductor field effect transistors (MESFETs) and pseudomorphic high electron mobility transistors (pHEMTs)) or complementary metal-oxide semiconductor (CMOS) technology.

TX/RX circuitry 210 receives from antenna 202 an incoming signal, transmitted by, for example, a communication system or a wireless network provider, through switch/duplexer 204 and receiver 208. TX/RX circuitry 210 processes and sends the incoming signal to the speaker (i.e., voice data) or to main processor 214 (e.g., web browsing) for further processing. Likewise, TX/RX circuitry 210 receives analog or digital voice data from the microphone or other outgoing data (e.g., web data, e-mail) from main processor 214. TX/RX circuitry 210 transmits an RF signal that is transmitted through transmitter 206 via antenna 202.

Main processor 214 executes a basic operating system program stored in memory 218 in order to control the overall operation of wireless device 200. For example, main processor 214 controls the reception of signals and the transmission of signals by TX/RX circuitry 210, receiver 208, and transmitter 206. Main processor 214 is capable of executing other processes and programs resident in memory 218 and may move data into or out of memory 218, as required by an executing process.

Main processor 214 is also coupled to display/keypad 216. The user of wireless device 200 uses the keypad to enter data into wireless device 200. The display may be a liquid crystal display capable of rendering text and/or at least various graphics; alternate embodiments may use other types of displays. Battery 220 is coupled with the electrical components of wireless device 200, in accordance with known electrical principles.

Those skilled in the art will recognize that wireless device 200 is given by way of example and that for simplicity and clarity, only so much of the construction and operation of wireless device 200 as is necessary for an understanding of the present invention is shown and described. For example, wireless device 200 is capable of communicating using one or more of a number of conventional standards, including, but not limited to GSM/EDGE, CDMA, W-CDMA, or the like. In addition, or as an alternative, although an exemplary wireless device 200 is shown and described, embodiments of the present invention contemplate any suitable component or combination of components performing any suitable tasks in association with wireless device 200, according to particular needs. Moreover, it is understood that wireless device 200 should not be construed to limit the types of devices in which embodiments of the present invention may be implemented.

In accordance with the principles of embodiments of the present invention, the RF power amplifier circuitry of transmitter 206 of wireless device 200 provides for maintaining certain parameters within the RF power amplifier circuitry above certain threshold levels, as described below in greater detail. In addition, or as an alternative, below the threshold levels, the RF power amplifier circuitry control-loop parameters are unchanged.

Figure 3:
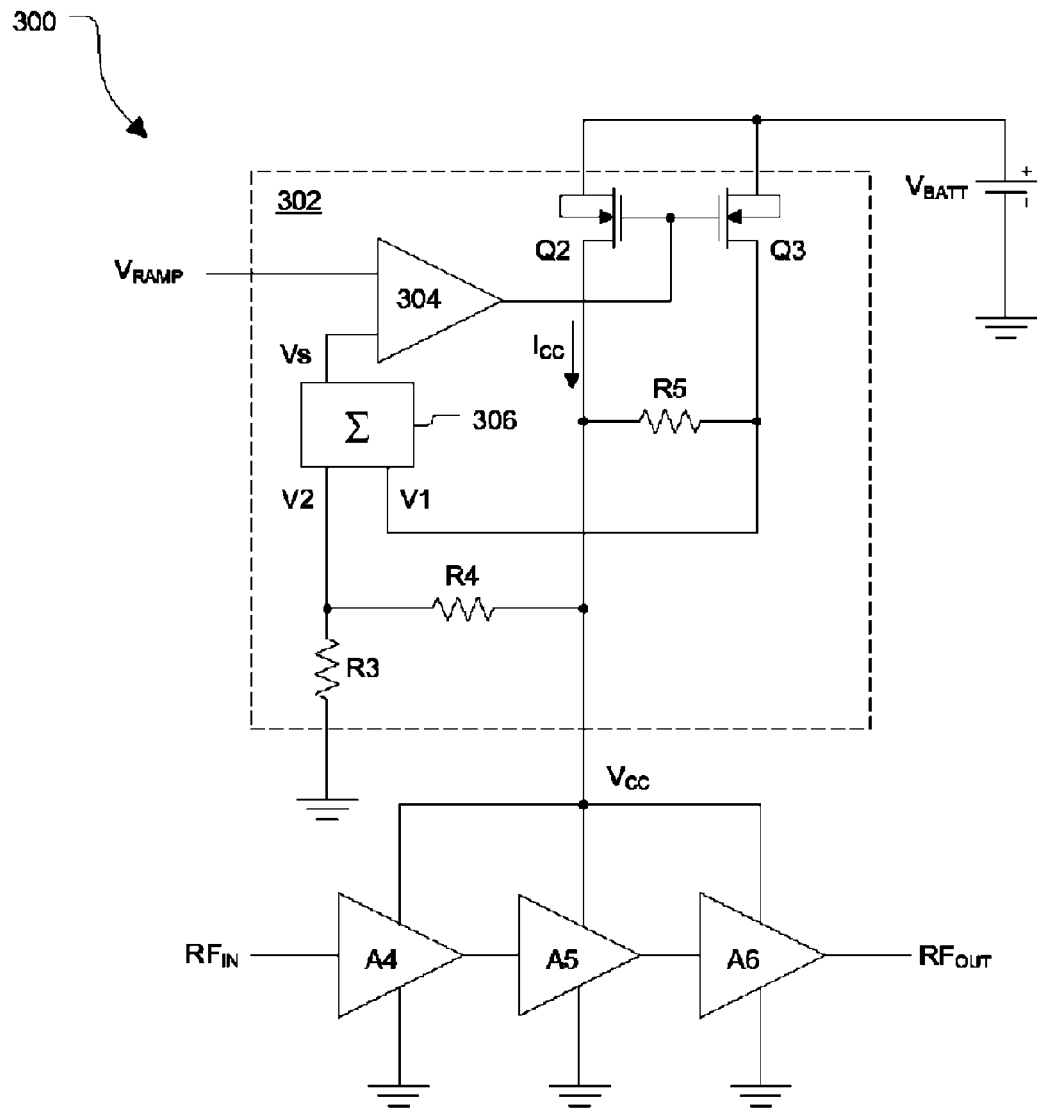
FIG. 3 illustrates a schematic diagram of a power-control circuit according to one embodiment of the present invention.

FIG. 3 illustrates a schematic diagram of a power-control circuit 300 according to one embodiment of the present invention. Power-control circuit 300 comprises a current limiting circuit 302, a $V_{RAMP}$ signal, a plurality of RF amplifier stages A4-A6, an $RF_{IN}$ signal, an $RF_{OUT}$ signal, and a battery voltage $V_{BATT}$. Current limiting circuit 302 comprises transistors Q2 and Q3, a differential amplifier 304, a summing network 306, a voltage divider network R3 and R4, and a resistor R5. Although differential amplifier 304 is shown and described as a differential amplifier, embodiments of the present invention contemplate any circuit which detects a difference in two voltage levels and outputs a signal corresponding to this difference.

In one embodiment of the present invention, transmitter 206 of wireless device 200 of FIG. 2 comprises RF power amplifier circuitry including power-control circuit 300. In addition or as an alternative, the plurality of RF amplifier stages A4-A6 are RF amplification stages associated with the RF power amplifier circuitry of wireless device 200. The plurality of RF amplifier stages A4-A6 may be driven by the $RF_{IN}$ signal via a RF driver stage or by TX/RX circuitry 210 of wireless device 200. In addition, the plurality of RF amplifier stages A4-A6 may transmit the $RF_{OUT}$ signal into a load. In one embodiment of the present invention, the load may be an antenna and may be, for example, antenna 202 of wireless device 200. The plurality of RF amplifier stages A4-A6, and in particular RF amplifier stage A6, may experience a load mismatch of antenna 202 of wireless device 200.

To further explain the operation of power-control circuit 300, an example is now given. In the following example, RF amplifier stage A6 experiences a load mismatch condition, such as, for example, when antenna 202 of wireless device 200 comes in close proximity with objects, for example, a hand, in the near field of antenna 202, or the like. Although a load mismatch condition of RF amplifier stage A6 of the plurality of RF amplifier stages A4-A6 is described as a load mismatch generated from an antenna mismatch condition, embodiments of the present invention contemplate any suitable load mismatch condition. For example, a load mismatch condition may be any load mismatch condition that causes collector current $I_{CC}$ to increase in the plurality of RF amplifier stages A4-A6, thereby increasing the power consumption and decreasing the battery life or exceeding the adjacent channel power ratio (ACPR) and error vector magnitude (EVM) limits of wireless device 200.

In an embodiment of the present invention, transistor Q3 is a current mirror transistor, and is coupled in parallel with transistor Q2, such that the gate and drain of transistor Q3 are coupled to the gate and drain of transistor Q2, respectively. Since transistor Q3 is configured as a mirror transistor, transistor Q3 senses a portion of the current flowing through transistor Q2, such that the current flowing through transistor Q3 is proportional to the current flowing through transistor Q2. In addition, because transistor Q3 is configured as a mirror transistor, transistor Q3 may be sized smaller than, for example, the size of transistor Q2. As an example only and not by way of limitation, transistor Q2 may be sized to handle several amps of current flowing through transistor Q2, wherein transistor Q3 may be sized to handle only a hundredth of the current flowing through transistor Q2. However, even though transistor Q3 may be sized smaller than transistor Q2, the current flowing through transistor Q3 is proportional to the current flowing through transistor Q2.

Thus, in accordance with the principles of embodiments of the present invention, the current flowing through transistor Q3 generates a voltage V1 that is proportional to collector current $I_{CC}$. Transistor Q3 provides voltage V1 at one input of summing network 306. Although transistor Q3 is shown and described as a current mirror transistor, embodiments of the present invention contemplate any suitable transistor or combination of transistors performing the same or substantially similar function as transistor Q3.

In an embodiment of the present invention, voltage divider network R3 and R4 senses collector voltage $V_{CC}$ that is supplied to the plurality of RF amplifier stages A4-A6. In addition, voltage divider network R3 and R4 provides a voltage V2 at another input of summing network 306, wherein voltage V2 is proportional to collector voltage $V_{CC}$. Voltages V1 and V2 are then applied to summing network 306. Summing voltage $V_S$ of summing network 306 has the following dependence on voltages V1 and V2:

$$V_S = \alpha \times V2 + \beta \times \max(0, I_{CC} - I_T) \quad (1)$$

where $\alpha$ and $\beta$ are fixed gains and threshold current $I_T$ is a threshold value that is set during the design phase of power-control circuit 300. In addition, $\alpha$ and $\beta$ provide the ability to determine how aggressively collector current $I_{CC}$ is limited by the threshold value of threshold current $I_T$.

To further explain the threshold value of threshold current $I_T$, an example is now given. In the following example, the maximum current of the plurality of RF amplifier stages A4-A6 may require a current limit, such as, for example, 2.3 Amps. The threshold value of threshold current $I_T$ may be set to any value below the current limit, such as, for example, 2.0 Amps. Although an example maximum current and an example threshold current $I_T$ is described, embodiments of the present invention contemplate using any maximum current or any threshold value of threshold current $I_T$.

As shown and described in equation 1, when collector current $I_{CC}$ is below the threshold value of threshold current $I_T$, the control-loop parameters of power-control circuit 300 are unchanged. For example, when collector current $I_{CC}$ is below the threshold value of threshold current $I_T$, 0 is the maximum as between 0 and ($I_{CC} - I_T$). Thus, multiplying $\beta$ by 0 eliminates $\beta$ from the calculation of summing voltage $V_S$, and summing voltage $V_S$ is proportional to collector voltage $V_{CC}$ because V2 is proportional to $V_{CC}$. In addition, when collector current $I_{CC}$ is equal to the threshold value of threshold current $I_T$, the control-loop parameters of power-control circuit 300 are also unchanged, because collector current $I_{CC}$ minus threshold current $I_T$ is equal to zero, (i.e., ($I_{CC} - I_T = 0$)).

However, when collector current $I_{CC}$ exceeds the threshold value of threshold current $I_T$, there is excess current, and summing voltage $V_S$ is increased by an amount proportional to the excess current. For example, summing voltage $V_S$, which is the output of summing network 306, is input into differential amplifier 304 and results in a reduction of collector voltage $V_{CC}$, thereby limiting the excess current. The form of the collector voltage $V_{CC}$ dependence is:

$$V_{CC} = G1 \times V_{RAMP} - G2 \times \max(0, I_{CC} - I_T) \quad (2)$$

where G1 and G2 are fixed gains. It is important to note, with reference to equation (2), that below the threshold value of threshold current $I_T$, collector voltage $V_{CC}$ is proportional to the $V_{RAMP}$ signal, with an essentially fixed gain G1. However, once collector current $I_{CC}$ exceeds the threshold value of threshold current $I_T$, the gain of collector voltage $V_{CC}$ and the $V_{RAMP}$ signal is progressively reduced with increasing current. Among other things, the continuity in collector voltage $V_{CC}$ coupled with the ability to adjust the gain about the threshold value of threshold current $I_T$, provides control-loop stability for power-control circuit 300 and minimizes any spurious emissions associated with the plurality of RF amplifier stages A4-A6.

Although current limiting circuit 302 is shown and described as supplying collector voltage $V_{CC}$ of the plurality of RF amplifier stages A4-A6, embodiments of the present invention contemplate supplying an output RF power amplifier stage, or a driver RF power amplifier stage, or any combination of RF power amplifier stages.

As described above, the threshold value of threshold current $I_T$ may be set to any value below a maximum current limit using current limiting circuit 302. However, unlike in the prior art, no abrupt discontinuity occurs in collector voltage $V_{CC}$ as a function of the $V_{RAMP}$ signal at the threshold value of threshold current $I_T$. Embodiments of the present invention use the threshold value of threshold current $I_T$ to progressively reduce the increasing current associated with the plurality of RF amplifier stages A4-A6 as collector voltage $V_{CC}$ is increased in response to the $V_{RAMP}$ signal. Among other things, this reduces any spurious emissions and unwanted harmonics in the frequency domain of embodiments of the present invention, which enables embodiments of the present invention to provide control-loop stability for power-control circuit 300.

In addition, because the maximum current of the plurality of RF amplifier stages A4-A6 is limited under load mismatch conditions, the battery life of, for example, battery 220 of wireless device 200, is increased relative to prior art circuits that do not limit the maximum current. Among other things, this increases the talk time associated with wireless device 200, improves the ruggedness of the plurality of RF amplifier stages A4-A6, and reduces any excessive heating associated with power-control circuit 300.

Figure 4:
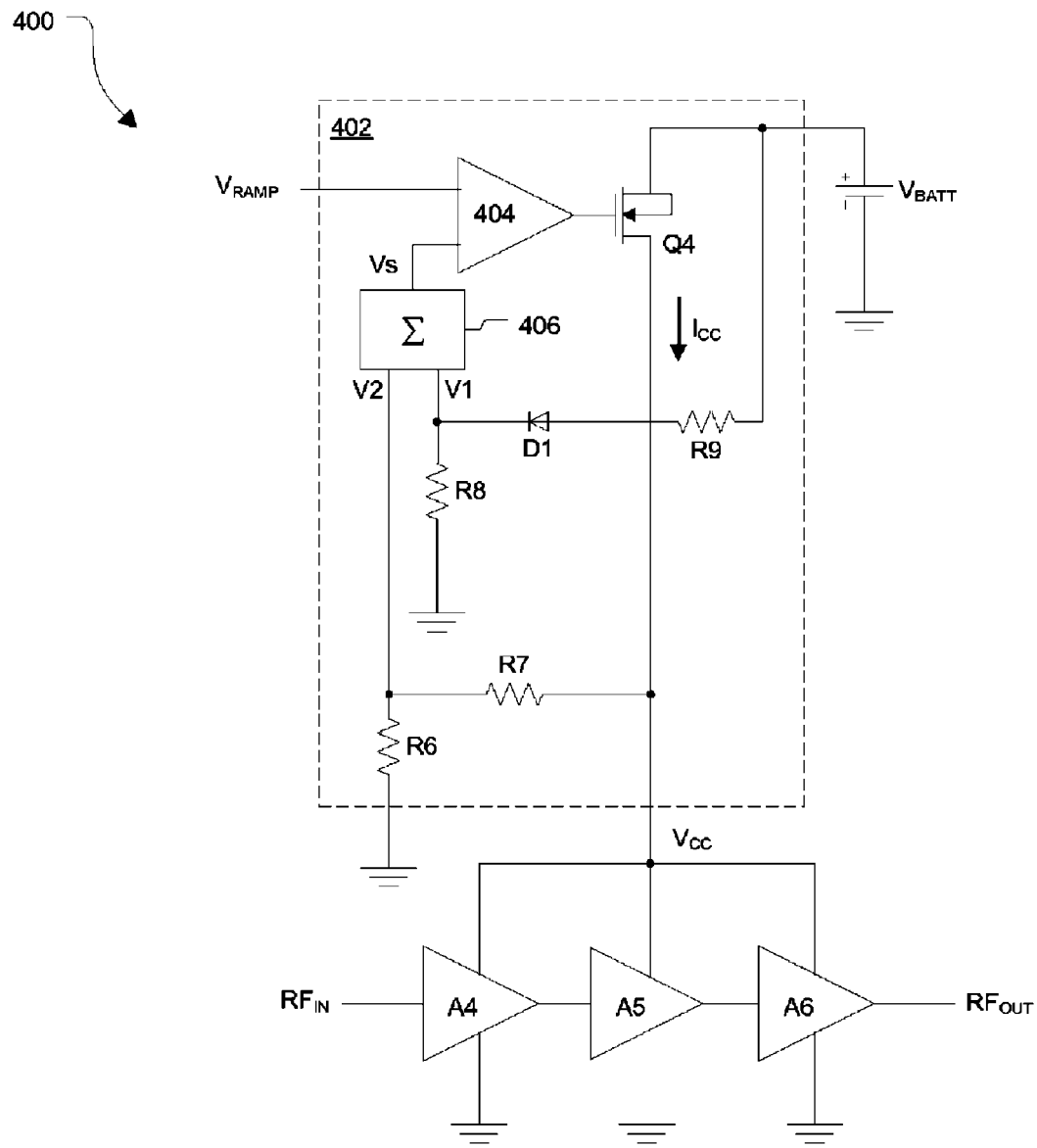
FIG. 4 illustrates a schematic diagram of a power-control circuit according to another embodiment of the present invention.

FIG. 4 illustrates a schematic diagram of a power-control circuit 400 according to another embodiment of the present invention. Power-control circuit 400 comprises a current limiting circuit 402, $V_{RAMP}$ signal, a plurality of RF amplifier stages A4-A6, $RF_{IN}$ signal, $RF_{OUT}$ signal, and battery voltage $V_{BATT}$. Current limiting circuit 402 comprises transistor Q4, a differential amplifier 404, a summing network 406, a diode D1, a voltage divider network R6 and R7, and resistors R8 and R9. As discussed above, although a differential amplifier is shown and described, embodiments of the present invention contemplate any circuit which detects a difference in two voltage levels and outputs a signal corresponding to this difference.

FIG. 4 is similar to FIG. 3, except that rather than using a current mirror transistor to generate voltage V1, embodiments of the present invention operate in conjunction with diode D1 and resistors R8 and R9 to generate voltage V1. For example, the voltage drop across a forward-biased diode, e.g., diode D1, will decrease with an increase in temperature. Therefore, voltage V1 increases with the increase in temperature in conjunction with resistors R8 and R9. In addition, as described above, voltages V1 and V2 are similarly applied to summing network 406 and the voltage dependencies of current limiting circuit 402 are:

$$V_S = \alpha \times V2 + \beta \times \max(0, T-T_0) \quad (3)$$

$$V_{CC} = G1 \times V_{RAMP} - G2 \times \max(0, T-T_0) \quad (4)$$

where T equals the temperature of diode D1, $T_0$ equals the threshold temperature, and $\alpha$, $\beta$, G1, G2, are fixed gains.

In one embodiment of the present invention, transmitter 206 of wireless device 200 of FIG. 2 comprises RF power amplifier circuitry including power-control circuit 400. In addition or as an alternative, the plurality of RF amplifier stages A4-A6 are RF amplification stages associated with the RF power amplifier circuitry of wireless device 200. The plurality of RF amplifier stages A4-A6 may be driven by the $RF_{IN}$ signal via a RF driver stage or by TX/RX circuitry 210 of wireless device 200. In addition, the plurality of RF amplifier stages A4-A6 may transmit the $RF_{OUT}$ signal into a load. In one embodiment of the present invention, the load may be an antenna and may be, for example, antenna 202 of wireless device 200. The plurality of RF amplifier stages A4-A6, and in particular RF amplifier stage A6, may experience a load mismatch of antenna 202 of wireless device 200.

In an embodiment of the present invention, diode D1 and resistors R8 and R9 of current limiting circuit 402 provide temperature compensation for power-control circuit 400. Although a single diode D1 and resistors R8 and R9 are shown and described for compensating for the temperature variation of power-control circuit 400, any number of diodes or resistors may be used. As an example only and not by way of limitation, when the temperature increases in power-control circuit 400, and in particular when the temperature increases in current limiting circuit 402, the voltage across diode D1 decreases and additional current is pulled through diode D1 and resistors R8 and R9, thereby providing an increase in voltage V1.

In addition, or as an alternative, when the temperature decreases in power-control circuit 400, and in particular when the temperature decreases in current limiting circuit 402, the voltage across diode D1 increases and less current is pulled through diode D1 and resistors R8 and R9, thereby resulting in a decrease in voltage V1. Thus, in accordance with the principles of embodiments of the present invention, diode D1 and resistors R8 and R9 provide for temperature compensation of power-control circuit 400.

Figure 5:
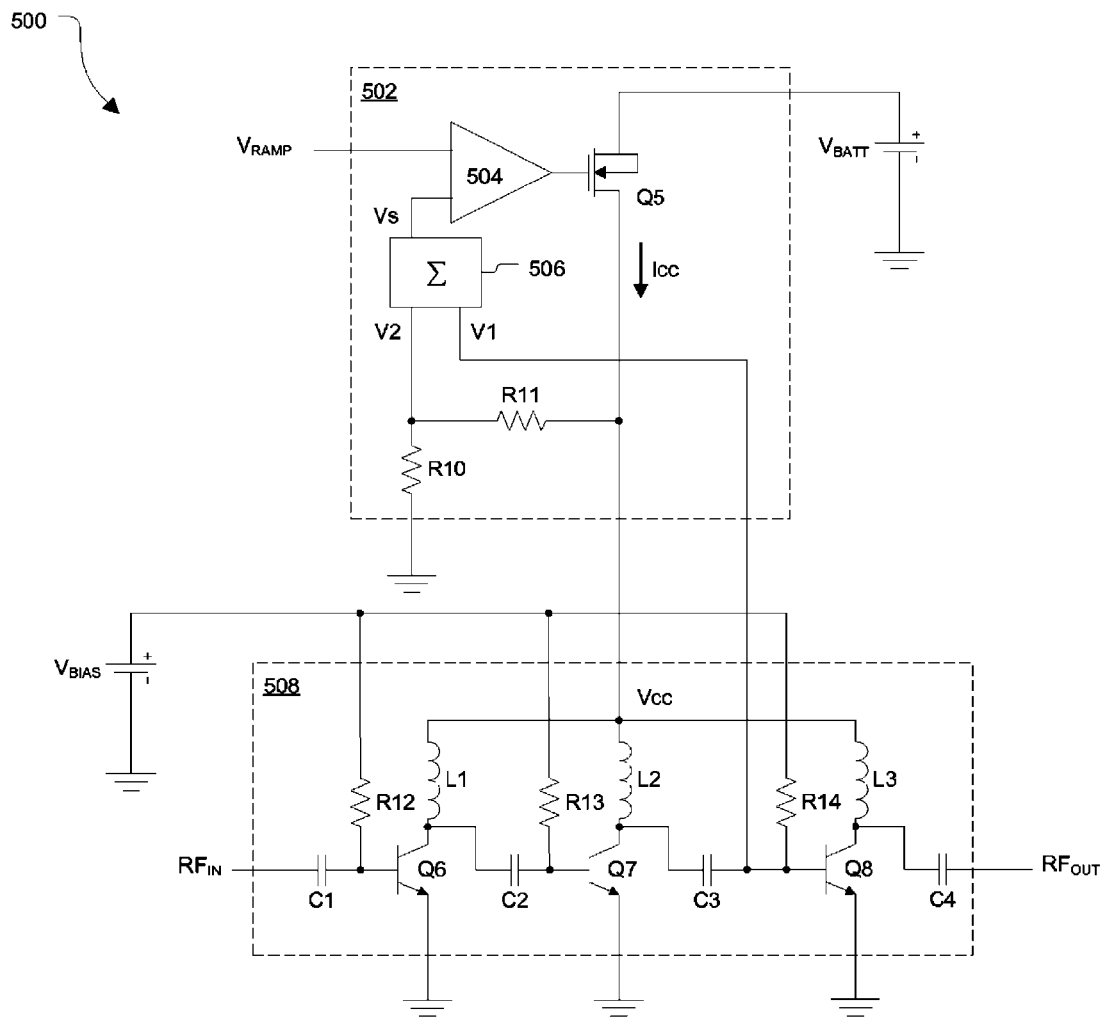
FIG. 5 illustrates a schematic diagram of a power-control circuit according to another embodiment of the present invention.

FIG. 5 illustrates a schematic diagram of a power-control circuit 500 according to another embodiment of the present invention. Power-control circuit 500 comprises a current limiting circuit 502, $V_{RAMP}$ signal, an RF amplifier circuit 508, $RF_{IN}$ signal, $RF_{OUT}$ signal, a bias voltage $V_{BIAS}$, and a battery voltage $V_{BATT}$. Current limiting circuit 502 comprises transistor Q5, a differential amplifier 504, a summing network 506, and a voltage divider network R10 and R11. As discussed above, although a differential amplifier is shown and described, embodiments of the present invention contemplate any circuit which detects a difference in two voltage levels and outputs a signal corresponding to this difference.

RF amplifier circuit 508 comprises transistors Q6-Q8, resistors R12-R14, capacitors C1-C4, and inductors L1-L3. For simplicity and clarity, only transistors Q6-Q8, resistors R12-R14, capacitors C1-C4, and inductors L1-L3 of RF amplifier circuit 508 are shown and described. Although RF amplifier circuit 508 is shown and described as having only these components, any number of transistors, capacitors, resistors, inductors, or other components may be used.

FIG. 5 is similar to FIG. 3, except that rather than using a current mirror transistor to generate voltage V1, embodiments of the present invention operate in conjunction with the bias network associated with RF amplifier circuit 508 to generate voltage V1. As an example only, and not by way of limitation, the bias network of RF amplifier circuit 508 generates a voltage V1 that is proportional to the current flowing through the output stage of RF amplifier circuit 508.

In one embodiment of the present invention, voltage V1 is generated from the bias network associated with the output stage of RF amplifier circuit 508. Although voltage V1 is shown and described as generated from the bias network of the output stage associated with RF amplifier circuit 508, embodiments of the present invention contemplate generating voltage V1 from the bias network associated with transistor Q6, or transistor Q7, or transistor Q8, or any combination of bias networks of RF amplifier circuit 508. In addition, as described above, voltages V1 and V2 are applied to summing network 506 and therefore, equations (1) and (2) are likewise valid for current limiting circuit 502.

In one embodiment of the present invention, transmitter 206 of wireless device 200 of FIG. 2 comprises RF power amplifier circuitry including power-control circuit 500. In addition or as an alternative, RF amplifier circuit 508 is a plurality of RF amplification stages associated with the RF power amplifier circuitry of wireless device 200. RF amplifier circuit 508 may be driven by the $RF_{IN}$ signal via a RF driver stage or by TX/RX circuitry 210 of wireless device 200. In addition, RF amplifier circuit 508 may transmit the $RF_{OUT}$ signal into a load. In one embodiment of the present invention, the load may be an antenna and may be, for example, antenna 202 of wireless device 200. RF amplifier circuit 508 and in particular transistor Q8 may experience a load mismatch of antenna 202 of wireless device 200.

Thus, in accordance with the principles of embodiments of the present invention, when the current increases in the bias network associated with RF amplifier circuit 508, collector voltage $V_{CC}$ is adjusted to limit the maximum collector current $I_{CC}$ of RF amplifier circuit 508. Among other things, this decreases the power consumption and increases the battery life of, for example, battery 220, of wireless device 200 relative to prior art circuits that do not limit the maximum current. In addition, among other things, this increases the talk time associated with wireless device 200, improves the ruggedness of RF amplifier circuit 508, and reduces any excessive heating associated with power-control circuit 500.

Figure 6:
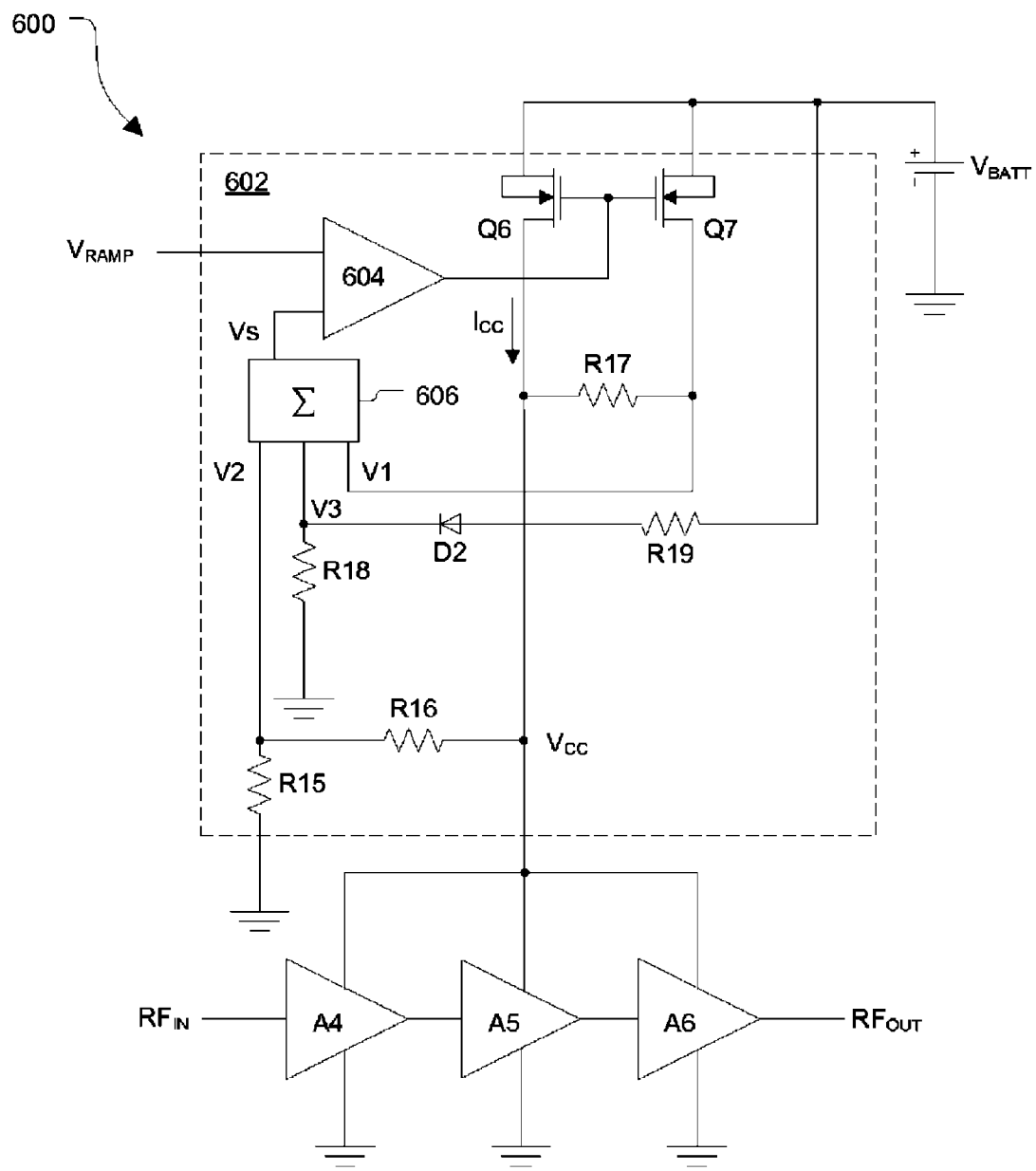
FIG. 6 illustrates a schematic diagram of a power-control circuit according to another embodiment of the present invention.

FIG. 6 illustrates a schematic diagram of a power-control circuit 600 according to another embodiment of the present invention. Power-control circuit 600 comprises a current limiting circuit 602, $V_{RAMP}$ signal, a plurality of RF amplifier stages A4-A6, $RF_{IN}$ signal, $RF_{OUT}$ signal, and battery voltage $V_{BATT}$. Current limiting circuit 602 comprises transistors Q6 and Q7, a differential amplifier 604, a summing network 606, a diode D2, a voltage divider network R15 and R16, and resistors R17-19. As discussed above, although a differential amplifier is shown and described, embodiments of the present invention contemplate any circuit which detects a difference in two voltage levels and outputs a signal corresponding to this difference.

As described above, the current flowing through transistor Q7 generates a voltage V1 at one input of summing network 606, wherein voltage V1 is proportional to the current flowing through transistor Q6. In addition, voltage divider network R15 and R16 provides a voltage V2 at another input of summing network 606, wherein voltage V2 is proportional to collector voltage $V_{CC}$. In addition, or as an alternative, diode D2 and resistors R18 and R19 generate voltage V3 at another input of summing network 606, wherein voltage V3 provides for temperature compensation for power-control circuit 600. Voltages V1-V3 are then applied to summing network 606. Summing voltage $V_S$ and collector voltage $V_{CC}$ have the following dependencies on voltages V1-V3:

$$V_S = \alpha \times V2 + \beta 1 \times \max(0, I_{CC} - I_T) + \beta 2 \times \max(0, T - T_0) \quad (5)$$

$$V_{CC} = G1 \times V_{RAMP} - G2 \times \max(0, I_{CC} - I_T) - G3 \times \max(0, T - T_0) \quad (6)$$

where T equals the temperature of diode D2, $T_0$ equals the threshold temperature, and $\alpha$, $\beta_1$, $\beta_2$, $G_1$, $G_2$, and $G_3$ are fixed gains.

In one embodiment of the present invention, transmitter 206 of wireless device 200 of FIG. 2 comprises RF power amplifier circuitry including power-control circuit 600. In addition or as an alternative, the plurality of RF amplifier stages A4-A6 are RF amplification stages associated with the RF power amplifier circuitry of wireless device 200. The plurality of RF amplifier stages A4-A6 may be driven by the $RF_{IN}$ signal via a RF driver stage or by TX/RX circuitry 210 of wireless device 200. In addition, the plurality of RF amplifier stages A4-A6 may transmit the $RF_{OUT}$ signal into a load. In one embodiment of the present invention, the load may be an antenna and may be, for example, antenna 202 of wireless device 200. The plurality of RF amplifier stages A4-A6 and in particular RF amplifier stage A6 may experience a load mismatch of antenna 202 of wireless device 200.

Thus, in accordance with the principles of embodiments of the present invention, when the collector current $I_{CC}$ increases in the plurality of RF amplifier stages A4-A6, collector voltage $V_{CC}$ is adjusted to limit the maximum collector current $I_{CC}$ of the plurality of RF amplifier stages A4-A6. Among other things, this decreases the power consumption and increases the battery life of, for example, battery 220, of wireless device 200 relative to prior art circuits that do not limit the maximum current. In addition, among other things, this increases the talk time associated with wireless device 200, improves the ruggedness of the plurality of RF amplifier stages A4-A6, and reduces any excessive heating associated with power-control circuit 600.

In another embodiment of the present invention, when the temperature increases in power-control circuit 600, and in particular when the temperature increases in current limiting circuit 602, the voltage across diode D2 decreases and additional current is pulled through diode D2 and resistors R18 and R19, thereby providing an increase in voltage V1. Conversely, when the temperature decreases in power-control circuit 600, and in particular when the temperature decreases in current limiting circuit 602, the voltage across diode D2 increases and less current is pulled through diode D2 and resistors R18 and R19, thereby providing an decrease in voltage V1. Thus, in accordance with the principles of embodiments of the present invention, diode D2 and resistors R18 and R19 provide for temperature compensation of power-control circuit 600.

Reference in the foregoing specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments of the present invention have been shown and described, it will be understood that various changes and modifications to the foregoing embodiments may become apparent to those skilled in the art without departing from the spirit and scope of the present invention. Accordingly, the invention is not limited to the embodiments disclosed, but rather by the appended claims and their equivalents.

What is claimed is:

1. A circuit, comprising:
   a transistor having a gate, a drain, and a source, the source of the transistor coupled with a voltage;
   a summing network having a first voltage input, a second voltage input, and an output, the first voltage input of the summing network capable of receiving a voltage that is proportional with a current flowing through the transistor;
   a differential circuit having a first input, a second input, and an output, the first input of the differential circuit coupled with the output of the summing network, the second input of the differential circuit coupled with a voltage ramp signal, and the output of the differential circuit coupled with the gate of the transistor; and
   a voltage divider network coupled between the drain of the transistor and the second voltage input of the summing network.

2. The circuit of claim 1, wherein:
   the output of the summing network is a summing voltage based on:

$$V_S = \alpha \times V2 + \beta \times \max(0, I - I_T)$$

wherein $\alpha$ and $\beta$ are representative of fixed gains, $I_T$ is representative of a threshold value of a threshold current, I is representative of the current flowing through the transistor, and V2 is the voltage at the second voltage input of the summing network; and
   a form of the voltage of a radio frequency (RF) amplifier coupled with the current limiting circuit is based on:

$$V = G1 \times V_{RAMP} - G2 \times \max(0, I - I_T)$$

wherein G1 and G2 are representative of other fixed gains, $I_T$ is representative of the threshold value of the threshold current, I is representative of the current flowing through the transistor, and $V_{RAMP}$ is the voltage ramp signal applied with the second input of the differential circuit.

3. The circuit of claim 1, wherein the voltage divider network comprises a first resistor coupled between the drain of the transistor and the second input of the summing network and a second resistor coupled between the second input of the summing network and a ground.

4. The circuit of claim 1, wherein the transistor is a first transistor, the current limiting circuit further comprising:
   a second transistor having a gate, a drain, and a source, the gate of the second transistor coupled with the gate of the first transistor, the source of the second transistor coupled with the source of the first transistor and the voltage, the drain of the second transistor coupled with the first voltage input of the summing network.

5. The circuit of claim 4, further comprising a resistor coupled between the drain of the first transistor and the drain of the second transistor.

6. The circuit of claim 4, wherein the second transistor is a mirror transistor and a current through the second transistor is proportional with the current flowing through the first transistor.

7. The circuit of claim 6, wherein the summing network further comprises a third voltage input, the third voltage input of the summing circuit coupled with a temperature compensation network.

8. The circuit of claim 7, wherein:
the output of the summing network is a summing voltage based on:

$$V_S = \alpha \times V2 + \beta 1 \times \max(0, I-I_T) + \beta 2 \times \max(0, T-T_0)$$

wherein $\alpha$, $\beta 1$, and $\beta 2$ are representative of fixed gains, $I_T$ is representative of a threshold value of a threshold current, I is representative of the current flowing through the first transistor, T is representative of a temperature of a component, $T_0$ is representative of a threshold temperature, and V2 is the voltage at the second voltage input of the summing network; and a form of the voltage of a radio frequency (RF) amplifier coupled with the current limiting circuit is based on:

$$V = G1 \times V_{RAMP} - G2 \times \max(0, I-I_T) - G3 \times \max(0, T-T_0)$$

wherein G1, G2, and G3 are representative of other fixed gains, $I_T$ is representative of the threshold value of the threshold current, I is representative of the current flowing through the transistor, T is representative of a temperature of a component, $T_0$ is representative of the threshold temperature, and $V_{RAMP}$ is the voltage ramp signal applied with the second input of the differential circuit.

9. The circuit of claim 1, further comprising a temperature compensation network coupled between the voltage and the first voltage input of the summing network.

10. The circuit of claim 9, wherein the temperature compensation network comprises:
a diode coupled between the first voltage input of the summing network and a first resistor, wherein the first resistor is coupled between the diode and the voltage; and
a second resistor coupled between the first voltage input of the summing network and a ground.

11. The circuit of claim 10, wherein:
the output of the summing network is a summing voltage based on:

$$V_S = \alpha \times V2 + \beta \times \max(0, T-T_0)$$

wherein $\alpha$ and $\beta$ are representative of fixed gains, T is representative of a temperature of a component, $T_0$ is representative of a threshold temperature, and V2 is the voltage at the second voltage input of the summing network; and a form of the voltage of a radio frequency (RF) amplifier coupled with the current limiting circuit is based on:

$$V = G1 \times V_{RAMP} - G2 \times \max(0, T-T_0)$$

wherein G1 and G2 are representative of other fixed gains, T is representative of the temperature of the component, $T_0$ is representative of the threshold temperature, and $V_{RAMP}$ is the voltage ramp signal applied with the second input of the differential circuit.

12. The circuit of claim 1, further comprising a plurality of radio frequency (RF) amplifier stages capable of amplifying a RF signal, wherein the first voltage input of the summing network is coupled with a bias network of the plurality of RF amplifier stages.

13. The circuit of claim 1, wherein the current limiting circuit is fabricated in complementary metal-oxide semiconductor (CMOS).

14. The circuit of claim 1, further comprising a plurality of radio frequency (RF) amplifier stages coupled with the current limiting circuit, wherein at least the output stage of the plurality of RF amplifier stages is fabricated in a semiconductor field effect transistor technology selected from the group consisting of:
pseudomorphic high electron mobility transistor;
metal semiconductor field effect transistor;
junction field effect transistor;
high electron mobility transistor;
metamorphic high electron mobility transistor;
heterostructure field effect transistor; and
modulation-doped field effect transistor.

15. The circuit of claim 14, wherein the semiconductor technology includes material selected from the group consisting of:
Gallium Arsenide;
Indium Phosphide;
Gallium Nitride;
Aluminum Gallium Arsenide;
Indium Gallium Arsenide;
Indium Gallium Phosphide;
Indium Aluminum Arsenide;
Aluminum Gallium Nitride;
Indium Gallium Nitride;
Gallium Arsenide Antimonide;
Indium Gallium Arsenide Nitride; and
Aluminum Arsenide.

16. A wireless device, comprising:
a transmitter for transmitting radio frequency (RF) signals, the transmitter comprising:
an output RF power amplifier stage; and
a current limiting circuit coupled with the output RF power amplifier stage for limiting the current of the output RF power amplifier stage, the current limiting circuit comprising:
a transistor having a gate, a drain, and a source, the source of the transistor coupled with a voltage;
a summing network having a first voltage input, a second voltage input, and an output, the first voltage input of the summing network capable of receiving a voltage that is proportional with the current flowing through the transistor;
a differential circuit having a first input, a second input, and an output, the first input of the differential circuit coupled with the output of the summing network, the second input of the differential circuit coupled with a voltage ramp signal, and the output of the differential circuit coupled with the gate of the transistor; and
a voltage divider network coupled between the drain of the transistor and the second voltage input of the summing network;
a battery connected to the transmitter of the wireless device; and
an antenna coupled to the output RF power amplifier stage of the transmitter.

17. The wireless device of claim 16, wherein:
the output of the summing network is a summing voltage based on:

$$V_S = \alpha \times V2 + \beta \times \max(0, I-I_T)$$

wherein $\alpha$ and $\beta$ are representative of fixed gains, $I_T$ is representative of a threshold value of a threshold current, I is representative of a current flowing through the transistor, and V2 is the voltage at the second voltage input of the summing network; and a form of the voltage of the output RF power amplifier stage is based on:

$$V = G1 \times V_{RAMP} - G2 \times \max(0, I-I_T)$$

wherein G1 and G2 are representative of other fixed gains, $I_T$ is representative of the threshold value of the threshold current, I is representative of the current flowing through the transistor, and $V_{RAMP}$ is the voltage ramp signal applied with the second input of the differential circuit.

18. The wireless device of claim 16, wherein the voltage divider network comprises a first resistor coupled between the drain of the transistor and the second input of the summing network and a second resistor coupled between the second input of the summing network and a ground.

19. The wireless device of claim 16, wherein the transistor is a first transistor, the current limiting circuit further comprising:
a second transistor having a gate, a drain, and a source, the gate of the second transistor coupled with the gate of the first transistor, the source of the second transistor coupled with the source of the first transistor and the voltage, the drain of the second transistor coupled with the first voltage input of the summing network.

20. The wireless device of claim 19, wherein the second transistor is a mirror transistor and a current through the second transistor is proportional with the current flowing through the first transistor.

21. The wireless device of claim 16, wherein the summing network further comprises a third voltage input, the third voltage input of the summing circuit coupled with a temperature compensation network.

22. The wireless device of claim 21, wherein:
the output of the summing network is a summing voltage based on:

$$V_S = \alpha \times V2 + \beta 1 \times \max(0, I-I_T) + \beta 2 \times \max(0, T-T_0)$$

wherein $\alpha$, $\beta 1$, and $\beta 2$ are representative of fixed gains, $I_T$ is representative of a threshold value of a threshold current, I is representative of a current flowing through the transistor, T is representative of a temperature of a component, $T_0$ is representative of a threshold temperature, and V2 is the voltage at the second voltage input of the summing network; and a form of the voltage of the output RF power amplifier stage is based on:

$$V = G1 \times V_{RAMP} - G2 \times \max(0, I-I_T) - G3 \times \max(0, T-T_0)$$

wherein G1, G2, and G3 are representative of other fixed gains, $I_T$ is representative of a threshold value of a threshold current, I is representative of the current flowing through the transistor, T is representative of the temperature of the component, $T_0$ is representative of the threshold temperature, and $V_{RAMP}$ is the voltage ramp signal applied with the second input of the differential circuit.

23. The wireless device of claim 16, further comprising a temperature compensation network coupled between the voltage and the first voltage input of the summing network.

24. The wireless device of claim 23, wherein the temperature compensation network comprises:
a diode coupled between the first voltage input of the summing network and a first resistor, wherein the first resistor is coupled between the diode and the voltage;
a second resistor coupled between the first voltage input of the summing network and a ground.

25. The wireless device of claim 24, wherein:
the output of the summing network is a summing voltage based on:

$$V_S = \alpha \times V2 + \beta \times \max(0, T-T_0)$$

wherein $\alpha$ and $\beta$ are representative of fixed gains, T is representative of a temperature of a component, $T_0$ is representative of a threshold temperature, and V2 is the voltage at the second voltage input of the summing network; and the form of the voltage of the output RF power amplifier stage is based on:

$$V = G1 \times V_{RAMP} - G2 \times \max(0, T-T_0)$$

wherein G1 and G2 are representative of fixed gains, T is representative of a temperature of the component, $T_0$ is representative of the threshold temperature, and $V_{RAMP}$ is the voltage ramp signal applied with the second input of the differential circuit.

* * * * *